United States Patent [19]

Borner et al.

[11] Patent Number: 4,665,421
[45] Date of Patent: May 12, 1987

[54] PHOTODIODE COMPRISING A RESONATOR STRUCTURE FOR INCREASING ABSORPTION

[75] Inventors: Manfred Borner; Gert Trommer, both of Munich; Reinhard Müller, Ingolstadt, all of Fed. Rep. of Germany

[73] Assignee: Siemens Aktiengesellschaft, Berlin and Munich, Fed. Rep. of Germany

[21] Appl. No.: 640,163

[22] Filed: Aug. 13, 1984

[30] Foreign Application Priority Data

Aug. 17, 1983 [DE] Fed. Rep. of Germany ....... 3329719

[51] Int. Cl.[4] ...................... H01L 27/14; H01L 31/00
[52] U.S. Cl. ......................................... 357/30; 372/49
[58] Field of Search ....................... 357/30, 19; 372/49

[56] References Cited

U.S. PATENT DOCUMENTS 4,202,000 5/1980 Carballes ............................... 357/19

OTHER PUBLICATIONS

Tien et al., "Integrated Optics: Putting It All Together", Bell Laboratories Record, Feb. 1981, pp. 39–45.

Primary Examiner—James W. Davie
Assistant Examiner—Georgia Y. Epps
Attorney, Agent, or Firm—Hill, Van Santen Steadman & Simpson

[57] ABSTRACT

A photodiode having optical resonators tuned different from one another and adjacent one another in a semiconductor body, whereby the resonators are in optical wave-coupling with one another.

11 Claims, 15 Drawing Figures

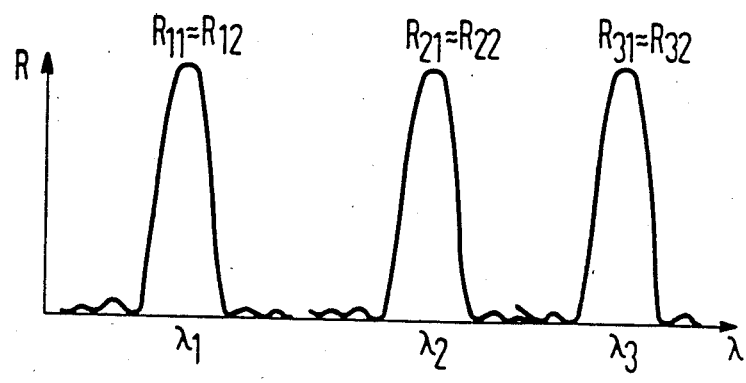
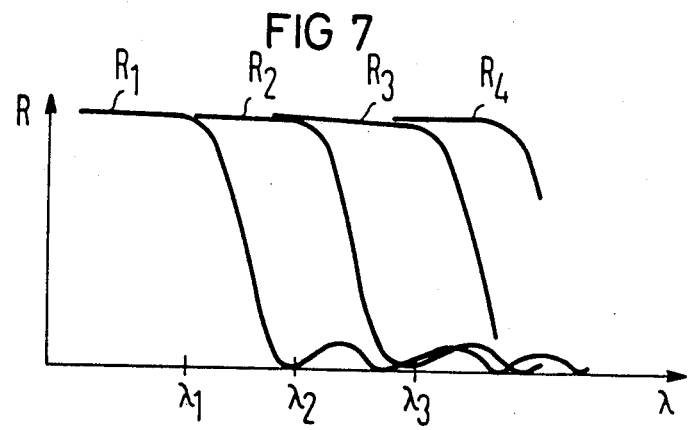
FIG 7
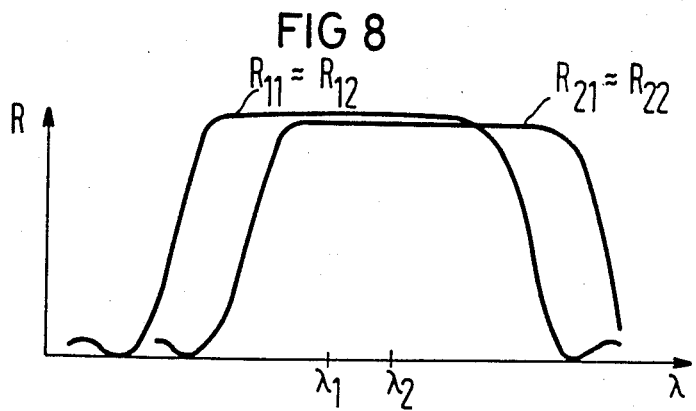
FIG 8

PHOTODIODE COMPRISING A RESONATOR STRUCTURE FOR INCREASING ABSORPTION

BACKGROUND OF THE INVENTION

1. Field of the Invention

The present invention relates to a photodiode of the type which comprises a semiconductor substrate, reflectors which form several optical resonators in the semiconductor substrate, and electrodes for the supply of current thereto and for the removal of electrical signals which are based on radiation reception in a single resonator or in several of the resonators, whereby, for the substrate, a material having a relatively low absorportion coefficient for the radiation to be detected and having good suitability for semiconductor-element integration is selected.

2. Description of the Prior Art

From the German published application No. 28 28 195, corresponding to U.S. Pat. No. 4,202,000, fully incorporated herein by this reference, a semiconductor diode is known which is also to be utilized as a photodiode. This diode may be constructed with an optical Fabry-Perot resonator and may be employed as a laser diode. Oppositely disposed surfaces of the semi-conductor chip serve as the mirror of the resonator. A high sensitivity to the radiation to be detected in the photo diode is achieved through the utilization of an avalanche effect.

An integrated semiconductor component is known from the Bell Laboratories Record, 1981, pp. 38–45, which consists of a laser and a detector which are both realized in the same semiconductor chip. Other details concerning the construction of the detector are not provided.

In the prior German patent application No. P 32 05 461.0, a photodiode is disclosed having an optical resonator serving for increasing absorption. The basis for this photodiode is to provide a structure for a photodiode which is of such a type which can be realized as an integrated component of a semiconductor chip in which there is at least an additional semiconductor function, particularly a laser. The photodiode corresponding to this earlier application is suitable, in particular, for silicon for which a wellknown integration technology has been developed. For optical purposes, however, silicon has the disadvantage that its band gap energy lies in the near infrared range where the application of optical means is of particular interest. Precisely near the band edge for wavelengths greater than equal to 1.1 µm the silicon has only a low specific absorption and is not considered utilizable for this range for photodiodes.

A comparable case exists for gallium arsenide as a material of the semiconductor chip; namely, for the combination of a laser with a photodiode, or, for the frequency range of the laser radiation to be generated in the gallium arsenide, the latter gallium arsenide is not useable for a photodiode of conventional construction due to lack of sufficient absorption behavior.

The solution suggested in the German application No. P 32 05 461.0 is that of constructing the photodiode in a semiconductor material having an absorption coefficient which is too low per se for photodiode, as an optical Fabry-Perot resonator, preferably as an asymmetrical resonator.

SUMMARY OF THE INVENTION

The object of the present invention is to provide a photodiode having a resonator and which comprises individual diodes having their resonators arranged adjacent one another in a semiconductor body, whereby the resonators are in optical interaction with one another.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 6 is a graphic illustration of the use of very narrow band reflection factors;

FIG. 7 is a graphic illustration of the use of wideband reflection factors;

FIG. 8 is a graphic illustration showing a possible case of reflection factors, through suitable selection of the intermediate space between resonators, a selected wavelength is absorbed in a second resonator although the reflection factors are large;

Figure 11:
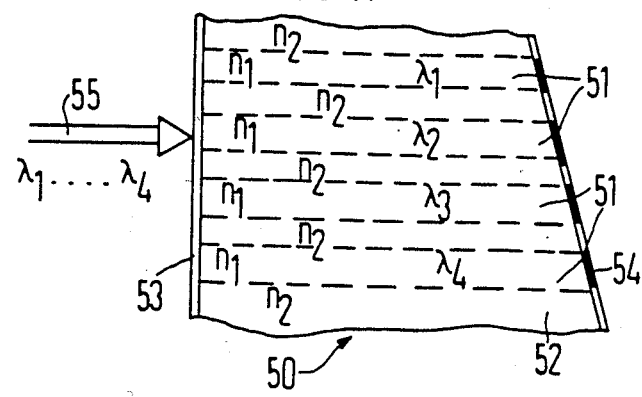
FIG. 11 is a schematic representation of an arrangement constructed in accordance with the present invention.
Figure 12:
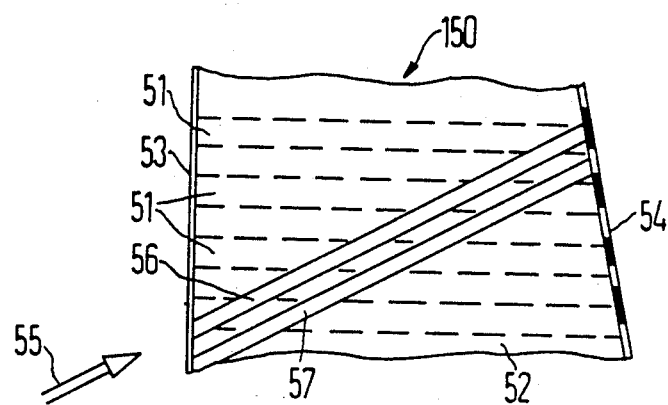
FIG. 12 is a schematic representation of a second embodiment of the invention.
Figure 13:
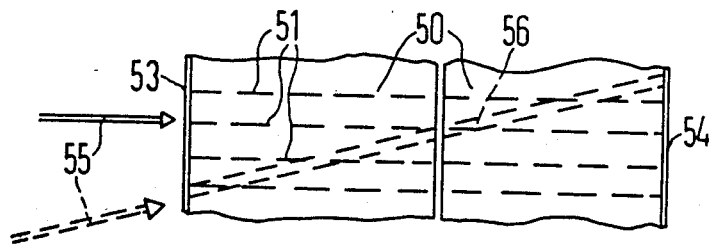
FIG. 13 is a schematic representation of another embodiment of the invention which utilizes a series arrangement of the previously-mentioned embodiments of the invention.

It should be pointed out here that FIGS. 1–10 illustrate details of embodiments of prior art and that FIGS. 11–13 illustrate embodiments of the present invention.

DESCRIPTION OF THE PREFERRED EMBODIMENTS

Before turning to the invention per se, a description of the art represented by FIGS. 1–10 is provided below.

Figure 1:
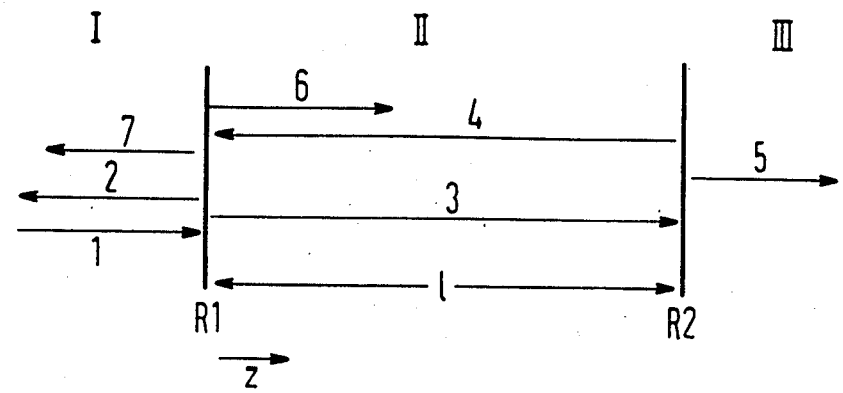
FIG. 1 is a schematic representation showing the operation of a diode employing the radiation-optical method of viewing.

Referring to FIG. 1, the method of operation of a diode according to the above-mentioned German application employing the radiation-optical method of viewing is illustrated.

A core region II of a resonator is disposed entirely or partially in the space-charge zone of a photodiode. A region I and a region III are respectively before and behind the resonator. Reflectors R1 and R2 are provided on the light entry side and the light exit side, respectively, and possibly possess a finite expansion in the z direction. An incident light wave 1 is illustrated as striking the reflector R1 so that a partial wave 2 is reflected and an additional partial wave 3 penetrates into the resonator. The partial wave 3 is again reflected as a partial wave 4 at the reflector R2 and partially allowed to pass through as a partial wave 5 in the region III.

The partial wave 4 is again reflected as a partial wave 6 at the reflector R1 and also penetrates providing a partial wave 7 in the region I. The partial wave 6 can be further followed analogously to the partial wave 3, etc. The method of operation of the resonator is based on the fact that the light frequently passes through a distance 1; i.e. the effective absorption length amounts to a multiple of the length 1. The absorbed light intensity is therefore, in the case of a small $\alpha$, in comparison with a diode without a resonator, strongly increased so that its utilizability extends to larger wave lengths. The first reflected partial wave 2 interfers with the partial waves 7, etc., allowed to pass through into the region I again, and can be largely extinguished. Also, in the case of a large reflection factor of the reflector R1, therefore, the most intensity from the incoming wave 1 can penetrate the resonator. The operating state in which the partial wave 2 is most effectively reduced is called resonance.

With a given length 1 and a small absorption coefficient $\alpha$ the reflection factors of R1 and R2 can be optimized in relation to the absorbed light intensity. The above-described method of operation of the diode is maintained even then when the reflection factors of the reflectors R1 and R2 more or less deviate from the optimum values. The resonator structure is suited both for the application in the case of diodes with light irradiation perpendicularly to the pn junction and in the case of diodes having light irradiation parallel to the pn junctions (diodes with transverse irradiation).

Figure 2:
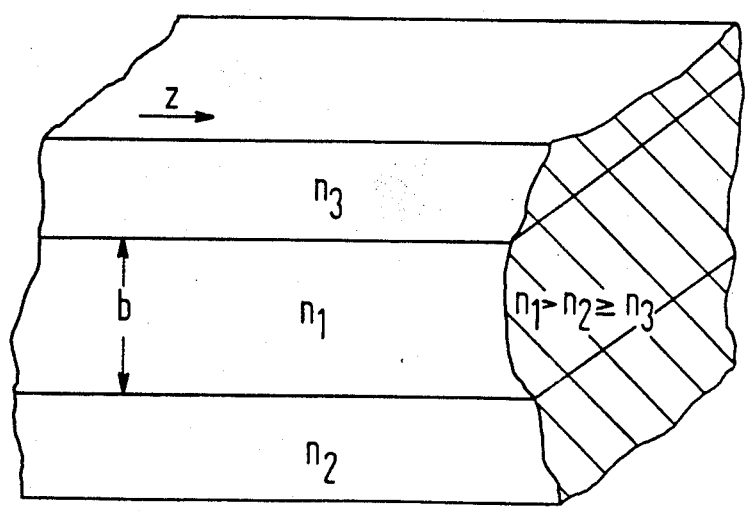
FIG. 2 is a fragmentary view of the layer structure of an optical waveguide having different refractive indices for the layers.

The light guidance in one or several of the zones I–III of a semiconductor substrate can be provided through a waveguide structure according to FIG. 2, whereby the guiding refractive index junctions, for example, are emphasized by various dopings with refractive indices $n_1 > n_2, \geq n_3$ of the zones 11–13. The selection of the dimensions b and the values of the refractive indices determine the number of guided light modes in the respective wave guide structure. In particular, there are the possibilities of the multi-mode and monomode waveguide structure, both of which enter into consideration for utilization in the case of a diode having a resonator structure.

The method of operation of a resonator for the purpose of absorption increase was investigated in a diploma paper of Reinhard Mueller, Technical University, Munich, 1981. However, only resonators were considered therein in which the reflection factors of the reflectors R1 and R2 are equal, and both originate from refractive index jumps, or interference reflectors, respectively. In addition, in this paper, reference was not made to the possibility of integration of a photodiode with a resonator structure with other components. The technical effort required in order to manufacture a good resonator (reflection factors close to 1) are hardly justified for a photodiode as an individual element (selection of another material). However, it is justified when the light absorption of the photo diode in an integrated circuit is increased by the resonator, and hence the utilizability of the entire integrated circuit in the desired frequency range is ensured or first made possible.

Figure 3:
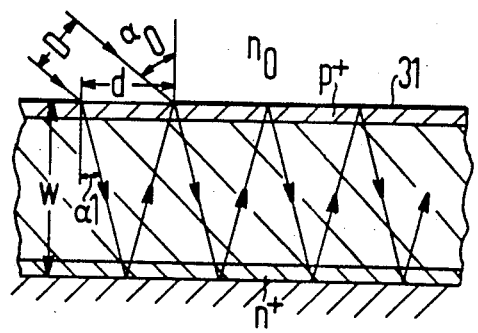
FIG. 3 is a schematic representation of the operation of a known diode.

The photodiode whose method of operation is described according to FIG. 1, differs significantly from the photodiode 30 of FIG. 3, known from the publication by Jörg Mueller in the IEEE Journal of Solid State Circuits, SC-13, 1978, pp. 173–179. According to this publication, in the case of the diode 30 according to FIG. 3, both the reflectors 31, 32 must be designed as metal mirrors. The consequence of this is that, because of the high transmission losses of metal mirrors, only a small, non-mirrored, or even an anti-reflection coated irradiation window 33 of a width d can be used or must be provided. The method of operation of the diode 30, therefore, is not based on an extinguishing of a first reflected partial wave by additional partial waves. However, for a diode according to the invention, this is a significant physical operation. In addition, in the case of a diode 30 according to FIG. 3, the width d must always be selected such that the relation $d \leq 2 \cdot w \cdot \tan \alpha_s$ applies, i.e. the angle $\alpha_s$ cannot be permitted to assume randomly small values without the dimension d becoming too small. A large angle $\alpha_s$, without countermeasures, has as a consequence great losses at the ends of the diode. In FIG. 3, the light leaves the diode or its barrier layer on its right side.

The novel feature of the diode (according to FIG. 1), by contrast, is that the irradiation is not restricted to a window and that the angle of the light path in the diode can assume randomly small values $\alpha_s$, in particular $\alpha_s = 0$, as is illustrated in FIG. 1, whereby laterally-radiated losses hardly occur. In the diode of this invention, the utilization of metal mirrors can be completely avoided, such as is desirable for application in integrated optics. What is significant in terms of the method of operation of the diode is that the reflector R1 is a low-loss mirror which, also in the case of a high reflection factor, allows sufficient light intensity to reach from the region I to the region II and from the region II to the region I.

The reflectors R1 and R2 can be produced in various ways. The most simple reflector consists of a simple refractive index jump.

Such a refractive index jump occurs, for example, on the fracture surface or cleavage surface of a semiconductor crystal, where the refractive index of a semiconductor material and that of the following agent, for example air, meet one another.

Reflectors with higher reflection factors very close to the value of 1 can be realized, for example by dielectric interference mirrors. The latter consist of successive layers of different refractive indices.

If the resonator is composed entirely or partially of waveguide pieces, a further possibility of the realization of the reflectors exist. Then, through structuring of the boundary surface n between $n_1$ and $n_2$ and/or $n_1$ and $n_3$, a so-called grating reflector can be formed (corrugation grating, Bragg reflection). The reflectors R1 and R2 may be based on different physical methods of operation. Therefore, for example, the reflector R1 can be an interference mirror and the reflector R2 can be a grating reflector. Since the photodiode is to be integrated with other components in a substrate, an interference mirror hardly enters into consideration for that particular light exit side which is not disposed on the edge of the substrate, because of the costly layer-wise manufacture of the same. The reflector in that instance will, in fact, be produced by a corrugation grating.

If a reflector R1, R2 forms a junction between two waveguides, generally mode conversion occurs in the case of the reflections; i.e. energy is conveyed in one mode of the waveguide into other modes. Through suitable design of the reflectors, mode conversion can be entirely or partially prevented, or at least reduced. If two symmetric waveguides ($n_2 = n_3$) meet with one another, for example, mode conversion can be largely prevented if, in both regions, the same value $n_1^2 - n_2^2$ is assumed.

The operating state of resonance can be obtained through a suitable selection of the ratio of wavelength (in the semiconductor material) to light path length between the reflectors R1 and R2. Through temperature changes during the operation, the length 1 of the diode can be altered due to thermal expansion, whereby the resonance condition is not satisfied. This can be counteracted by tuning devices.

Figure 4:
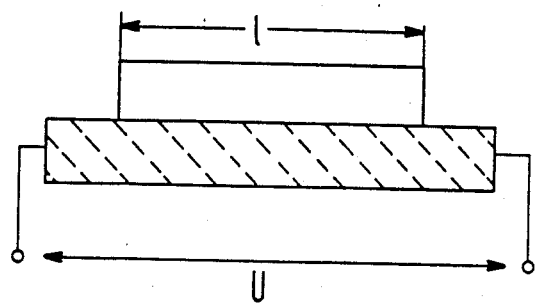
FIG. 4 is a schematic representation of an arrangement for adjusting a diode using a Peltier element.

Referring to FIG. 4, for a tuning of the diode it is provided, for example, to connect the latter with a regulating element 42 for the mechanical stress in the resonator. This regulating element 42 can consist of a piezoelement or a magnetorestrictive element.

A length variation of the diode can be counteracted through application of an electrical voltage U to the regulating element 42. A voltage variation on the regulating element, causes a variation of the mechanical stress, which has the consequence of a compression or stretching and/or a curvature of the diode. Both effects influence the light path in the diode and can be employed for the purpose of adjustment. With an irradiated normal frequency (pilot frequency) it can be determined whether the diode is in resonance, otherwise an adjustment can be initiated.

A further possibility for adjusting the diode is obtained if, in the arrangement of FIG. 4, the regulating element 42 is a Peltier element. With the latter, through heating or cooling, the temperature of the diode, and hence its resonator length 1, can be adjusted that the resonator is in resonance. The effect of the resonance causes a decrease of to half of the maximum value within the resonance bandwith. For diodes with a resonator, depending upon vacuum wavelength, in the case of an optimum selection of the reflection factors R1 and R2 in relation to the maximum absorption, half widths of between 0.5 nm and 2 nm can be obtained.

A possible application of a photodiode with a resonator structure is for example the wavelength region of around 1.1 μm for silicon photodiodes. A silicon photodiode with a resonator structure has in addition to the expanded wavelength region also the advantage that it could be combined in a silicon substrate together with other electronics and other electro-optical devices as an integrated circuit. This can occur, for example, by virtue of the fact that the diode with the respective reflectors is manufactured as the last step of an integrated circuit in that matched doped silicon layers are applied on a conventionally-manufactured circuit (1100° C. diffusion) with "cold" epitaxy (600° C., atomic ray epitaxy).

The integration of the photodiode on a silicon base is cited here only as an example. It can also proceed with other semiconductor materials, in particular, with such materials which are suited for the construction of lasers and which are direct semiconductors, such as gallium arsenide.

In an additional prior German patent application No. P 32 27 682.6, a further development of the invention of the previously-prior application is described which consist in optically series-connecting several photodiodes with resonator structures, corresponding to the first-mentioned prior application, whereby the individual resonators are tuned to various wavelengths. With the several series-connected optical resonators, radiation of a broader frequency spectrum can then be detected than would be possible with the corresponding photodiode with only one resonator having optimum efficiency.

Further explanations regarding the further developments according to the last-mentioned prior German application shall be apparent from the following discussion of certain embodiments.

Figure 5A:
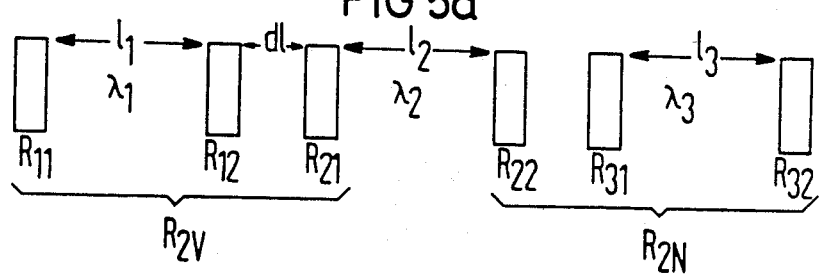
FIGS. 5a and 5b illustrate possible arrangments of diodes and reflectors.
Figure 5B:
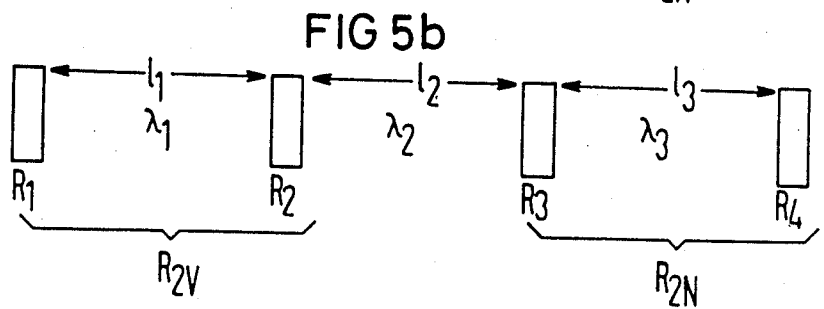

FIGS. 5a and 5b illustrate the already-discussed possible arrangements of the diodes and reflectors. They contain, for example, three diodes; actually more or fewer diodes can be successively arranged. The absorption in the diodes shall take place in the case of the wavelengths $\lambda_1$, $\lambda_2$ and $\lambda_3$. Rectangles designate mirrors, whatever physical properties they are based on. The lengths $1_1$, $1_2$, $1_3$ designate the lengths of the photodiodes, which may be based on any suitable principle (e.g. diodes with longitudinal or transverse irradiation, avalanche diodes, etc).

The method of operation of the demultiplexer device is to be explained with the example of the center diode with the absorption wavelength $\lambda_2$. The totality of diodes and reflectors, which are disposed before or behind the absorbing path $1_2$, form the lossy effective reflectors $R_{2V}$ and $R_{2N}$. Both of the individual reflectors $R_{11}$, $R_{12}$, $R_{21}$ etc, or $R_1$, $R_2$, etc and the effective reflectors $R_{2V}$ and $R_{2N}$ have wavelengths dependent reflection factors. If the irradiated light is disposed in a wavelength region having a small $\alpha$, only nominal absorption occurs in the diode with a length $1_2$ if first the resonance condition for $\lambda_2$ is satisfied and, second, $R_{2V}$ and $R_{2N}$ assume matching values so that the method of operation of the optical resonator is guaranteed. On the other hand, diodes having the lengths $1_1$ and $1_3$, must not satisfy the resonance condition for $\lambda_2$ or the wavelength dependent reflection factors must be constituted that the effective resonator, for these both diodes act very poorly about the wavelength $\lambda_2$. Then, because of the small $\alpha$,x light intensity is hardly absorbed in these diodes. If, nevertheless two diodes should absorb some light of the same wavelengths, an electronic circuit can seperate the signals. If, for example, the wavelength $\lambda_1$ is absorbed only in the first diode and the wavelength $\lambda_2$ in the first diode and the second diode, a logic circuit can decide whether only the wavelength $\lambda_1$ or only the wavelength $\lambda_2$ or the wavelengths $\lambda_1$ and $\lambda_2$ were irradiated. In summary, it can be stated that, for the described demultiplexer device, both the wavelength-dependent reflectors and the fact that the absorption is increased by a resonator, are important.

The bandwidth of the mirrors used determines how the reflectors can be arranged or must be arranged. Three cases are distinguished:

1. Narrow Band Reflectors (FIG. 6)

If the reflection factors of the reflectors are very narrow band, as in FIG. 6, the individual resonators can be so selected that they are independent of one another. In a wavelength region near a wavelength $\lambda_2$, for example, only the reflectors $R_{21}$ and $R_{22}$ have high reflection factors, whereas those of other reflectors assume only small, values. The dependence of the reflection factors of the reflectors $R_{21}$ and $R_{22}$ on the wavelength, need not be absolutely equal in this example. Both reflection factors, however, must be sufficiently large, near $\lambda_2$, in order that resonance of the required high quality occurs. Therefore, the designation $R_{21}$, $R_{22}$ applies.

The sequence of $\lambda_1$, $\lambda_2$, $\lambda_3$ can be arbitrarily selected. Since, $\alpha$, drops with increasing wavelength $\lambda$, it is favorable that the larger wavelengths are inserted further back in the geometric sequence.

Because the light, which should be absorbed in the backward diodes must penetrate the front diodes, a small $\alpha$ is desirable. This also applies to the following instances.

2. Broadband Reflectors Arranged Such that Irradiated Resonators Exhibit Reflection Factors which are as Small as Possible If the individual reflectors have relatively broad reflection factors, a suitable arrangement of the reflectors (according to their reflection factor dependence on the wavelength) makes it possible that a resonator situated further behind is influenced as little as possible by the front mirrors. An arrangement according to FIG. 7 is desirable because the reflection factors, for example through arbitrary succession of $R_1$ and $R_2$ in FIG. 1b, reinforce one another. If $R_1$ in the case of $\lambda_2$ has not yet dropped sufficiently, $R_{2V}$ can become so large that no light reaches the second resonator. Therefore, the sequence of mirrors and wavelengths to be absorbed is determined here. The wavelengths can increase (FIG. 7) or drop.

3. Broadband Filters, Irradiation of a Preceding Active Resonator

In the case of very broadband mirrors in an arrangement according to FIG. 5a, through a suitable selection of the intermediate space d1, it is made possible that the wavelength $\lambda_2$ is absorbed in the second resonator, although the reflection factors of the reflectors $R_{11}$ and $R_{12}$ are large. In these instances, however, most often also the resonator 1 absorbs at the wavelength $\lambda_2$ so that this third instance most frequently must be reinforced by an electronic evaluation.

The arrangements 5a and 5b, as well as the three cases set forth above can, naturally, also occur mixed in a linear arrangement of diodes.

Figure 9A:
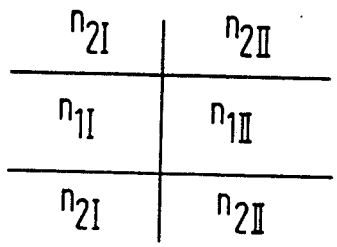
FIGS. 9a and 9b illustrate the section of dielectric or of a grating mirror respectively, the latter having a rectangular grating.

A waveguide structure which is monomode or multimode can provide the lateral light guidance in the linearly-arranged diodes or in the mirrors. Also, a curved or bent waveguide is addressed here as a linear arrangement. Mode conversions can be prevented through a suitable design of the mirrors. If two waveguides meet, mode conversion for example can be largely prevented if the relation of the refractive indices $n_1^2 - n_2^2$ in both waveguides has the same value (FIG. 9a).

On the same waveguides on which the photodiodes are arranged, also one or more lasers can be arranged whose reflectors likewise exhibit wavelength dependencies, so that either the light to be received irradiates the laser without obstruction or the light to be transmitted irradiates the demultiplexer device without obstruction. This applies to the case in which the technical requirements of the user permit various wavelengths for photodiodes and laser diodes on a substrate. Of course, lasers and demultiplexers can also be integrated in the parallel arrangement.

Also, several of these linear demultiplexers can be adjacently integrated on a substrate, whereby a preceding separation of respectively several carriers through conventional demultiplexers can be carried out which are either not integratable (e.g. fiber optic switches) or, however, can also be integrated on the same substrate (e.g. geodetic lenses, step reflectors, etc).

Figure 9B:
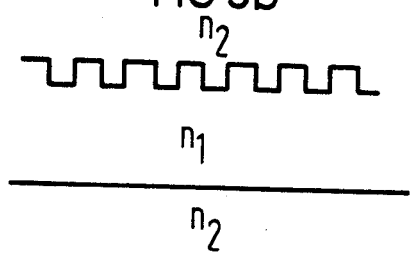
Figure 10:
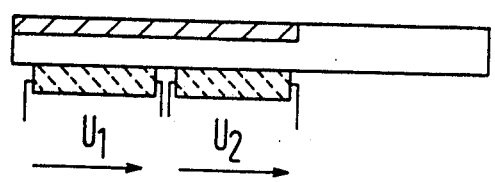
FIG. 10 is a schematic representation of a series of regulating elements applied beneath a substrate for regulating a demultiplexer.

As reflectors, on the one hand, so-called grating reflectors can be employed which most often are very narrow band. These are obtained through structuring of the boundary surface between the core region and the exterior space of a waveguide. FIG. 9b illustrates, for example, the section of a grating mirror having a rectangular grating. The grating, however, can have any other spatially-periodic structure (e.g. sine). This structure can be manufactured, for example, by methods which employ photolithography or electron beam lithography. Another type of mirror is the dielectric mirror which consist of several layers of different refractive indices. The length of these layers and the height of the refractive index jumps, in addition to the number of layers, determine the width (wavelength region) and height of the reflection factor. A possibility of manufacturing dielectric mirrors in integrated circuits is, for example, the method of ion implantation.

For the adjustment or tuning of the demultiplexer to the desired wavelengths, all effects can be employed which alter the length of the diodes to a sufficient extent via mechanical or thermal effects. Reinforcement through electronic circuits and/or test signals is possible. According to FIG. 10, for example, one or more series-disposed regulating elements are applied beneath the substrate, which regulating elements, for example, consist of piezoelements of magnetorestrictive elements. Through application of electrical voltages, these elements bring about mechanical stress on the entire demultiplexer, or on parts of the demultiplexer, so that resonance for desired frequencies is obtained via a compression or expansion and/or curving of the diodes. With the aid of irradiated test signals or a sequence of test signals, a regulation of the tuning or adjustment can obtained. A possible application of a demultiplexer consisting of integrated photodiodes is, for example, the wavelength region of 1–1.1 $\mu$m for silicon. A demultiplexer consisting of silicon would also have the advantage that it could be integrated on a silicon substrate with electronics and other electro-optical devices.

The integration of the demultiplexer device on a silicon base is mentioned here only as a example. It can be also realized with other semiconductor materials, particularly with such materials which are suited for the construction of lasers.

Underlying the present invention to be described in the following is the object of providing a further development based on principles of the two previously-cited prior applications, which further development is a photodiode having optimum properties, whereby the optimization is also to consist in several respects, in particular, simple technical realizability, broadband sensitivity, range of detection, high detection sensitivity; namely, particularly in the case of utilization of a semiconductor material for the chip, which, indeed, has optimum properties for further semiconductor functions integrated with the photodiode of the present invention in the chip, and which, however, would be little or not at all suited to a photodiode without the features of the invention.

The object is achieved with a photodiode which comprises a semiconductor substrate and reflectors which form several optical resonators in the semiconductor substrate. Electrodes for current supply and removal of the electrical signals which are based on radiation reception in a single or several of the resonators are provided. For the substrate, a material having a relatively low absorption coefficient for the radiation to be detected and having a good suitability for integration technology is selected. The photodiode is characterized in that the several optical resonators in the semiconductor substrate are arranged adjacent one another, that the optical resonators have an optical length differing from one another for receiving irradiation to be detected in a frequency-selective fashion or for receiving radiation to be detected having a greater bandwidth, and that adjacent optical resonators are separated from one another by a waveguide structure each having an adjacently-varying refractive index, but which are so closely adjacent that waveguide coupling between the resonators exist.

The consideration underlying the invention is that, for respective applied cases, it can be more favorable, concerning the optical path, to not need to arrange in series all the individual resonators, different with respect to their frequency characteristics, of the overall construction of such a photodiode; i.e. do not require such an arrangement in which the radiation is to be detected in the last resonator of this series has first passed through all of the resonators. The present invention provides a parallel arrangement of a number of resonators of this type.

According to a further feature of the invention, also such parallel arrangements, as components of the overall diode, can be series-connected according to the principle of the prior second-cited application. For example, 5 or 10 resonators can be adjacently arranged and a corresponding, preferably equal number, respectively, of such additional resonators can be spatially, successively arranged relative to the entry of the radiation to be detected.

Referring to FIG. 11, a first arrangement 50 comprises, for example, four adjacently-arranged optical resonators 51. These optical resonators result from the semiconductor material of the substrate 52 and the reflectors 53 and 54. The inclined position of the reflector 54 in relation to the reflector 53 is shown greatly exaggerated only for reasons of clarity. Both of the reflectors 53 and 54 act such that here, also, the radiation traveling back and forth per se for optical resonators builds up, according to the Fabry-Perot principle. The selectively is provided by the length tuning or adjustment. Moreover, at least one of the reflectors 53, 54, the case of an asymmetrical resonator, preferably the reflector with the higher degree of reflection, can be so constituted that reflection necessary for the respective optical resonator 51 occurs only in the surface areas of this reflector for which the effect of such an optical resonator is to occur. As is apparent from FIG. 11, this exists for the indicated strips $n_1$ of the substrate 52 so that this illustration shows four resonators. For the intermediately-disposed regions $n_2$ this exemplary embodiment has no resonator effect. These regions $n_2$, as already set forth above, serve the purpose of wave guidance of the radiation of the respective resonator 51 come into resonance in the respective enclosed region $n_1$.

The radiation to be detected by the diode of the present invention is indicated at 55. The case taken into consideration here is that the cross section of such radiation 55 is extremely minor; for example, this radiation has been advanced in a glass fiber. The radiation 55, as is apparent from FIG. 11, strikes one of the resonators 51 and enters through the reflector 53 into the optical resonator. The latter resonator, acting as an input coupling resonator, can have properties different from the other resonators, in particular, differing reflection factors of the reflectors. As a consequence of the known overcoupling of such radiation, which has entered the semiconductor substrate 52, into adjacent regions, components of the radiation 55 also reach the remaining, not directly-affected resonators 51.

Several input coupling resonators 56, 57, as shown in FIG. 12, are of particular interest when the radiation to be detected has already previously been subjected to a separation into wave regions, whereby radiation in this individual region is supplied to a respective associated input coupling guide. The resonators 51 are tuned to various resonant frequencies; namely, on the basis of the respective other resonator length 1 whose different dimension for each of the resonators result from the inclined position of the reflectors 53 and 54 relative to one another. Such a tuning is a measure which can be realized technologically in a relatively simple manner.

Given a corresponding narrow-bandedness of the individual resonators 51, for example given a correspondingly high quality of respective individual resonator, a selective frequnecy behavior results. An embodiment illustrated in FIG. 11 preferably possesses interference mirrors or dielectric mirrors as the reflectors 53 and 54. As has been mentioned above, the reflection capability is chosen in dependence on the absorption coefficient $\alpha$ of the radiation 55 to be detected, whereby, in particular, the above-described optimization can be achieved. In particular, for the reflector 53, the jump of the refractive index from the semiconductor material to the surrounding air can be sufficiently great so that the resonator effect for the resonators 51 (in cooperation with the reflector 54) is present. Arrangements having smaller incident angles are also possible in which an input coupling waveguide does not intersect all resonators. An intersection of all resonators, in this case, could be realized by several input coupling waveguides 56, 57.

FIG. 12 illustrates an embodiment 150 which, with respect to the construction of the resonators is basically similr to the embodiment according to FIG. 11. A significant different in the embodiment of FIG. 12 is that here, a beam direction 56, extending obliquely to the resonators 51, of the incident radiation 55 to be detected is present. In the embodiment of FIG. 11, the incident radiation intersects all resonator regions 51, so that here a direct input coupling of components of the radiation 55 to be detected into the resonators, tuned to the wavelengths $\lambda_1$–$\lambda_4$, is present.

For this input coupling, a waveguide 56 can be provided. Waveguides both with reflectors and without reflectors can be employed. They may be arranged or be effective, respectively, in, above, or below the plane of the resonators 51.

In the following, additional comments regarding designs of embodiments of the invention shall be provided. In constrast with embodiments of the second-cited prior application, in which the individual photodiode already comprise several resonators, in the case of the present invention, no mirrors need be realized in the interior of the semiconductor substrate 52. Nevertheless, here, also, a multiple arrangement of resonators is present which renders possible narrow band wavelength demultiplexing. Also here 11 individual resonators can have a high quality with a low absorption coefficient. The possibly necessary broadbandedness of the overall photodiode is present here, which is composed of the individual narrow band ranges. Such an embodiment according to FIGS. 11 and 12, for example, by way of comparison with an embodiment having serially-arranged resonators, is very short.

The properties of such an arrangement can be altered by:

Alteration of the coupling of the waveguides;
Alteration of the length of the resonators; and
Alteration of the reflection factor, in particular, those of the reflectors of the input coupling.

The arrangement acts as a demultiplexer if the absorption in the various reasonators takes place at various wavelengths. The overall photodiode or fractions thereof have broad and high absorption maxima, particularly when the position of the resonances in the various resonators lie closely adjacent one another and the absorption in these resonators can be viewed as a totality.

Also, in the case of the present invention, grating reflectors (corrugated mirrors) can be provided as the reflectors 53 and/or 54.

Several of the arrangements 50, or 150, respectively, as shown in FIG. 13, can also be serially arranged as partial arrangements, according to the principle of the second-sided application, whereby the input coupling into the individual series-arranged elements 50, 150 takes place through one or more waveguides, therefore, for example according to the principle of FIG. 11, whereby here the radiation 55 is irradiated in one or more resonators 51 of the first partial arrangement 50, or for example according to the principle of FIG. 12, whereby the radiation 55 is input coupled via at least one input coupling waveguide 56 (illustrated in broken lines).

Although we have described out invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A photodiode structure comprising:
   a semiconductor substrate for receiving light radiation, said substrate comprising a material having a low absorption coefficient for the radiation to be detected;
   reflectors forming a plurality of optical resonators arranged aligned and spaced apart in said substrate;
   electrodes carried on said substrate for removing electrical signals in response to radiation reception in at least one of said resonators;
   each of said resonators having a respective optical length different from that of the others of said resonators; and
   a plurality of wave guide structures, each of said wave guide structures having different refractive indices and located with respect to one another to provide optical wave-coupling between adjacent resonators.

2. A photodiode of claim 1, wherein: said electrodes are electrically separated to provide different signals from different resonators.

3. The photodiode of claim 1, wherein: said electrodes are interconnected to provide common signals from several resonators.

4. The photodiode of claim 1, wherein:
   said plurality of resonators comprise a first common mirror at one end and a second common mirror at the opposite end.

5. The photodiode of claim 1, wherein:
   each of said resonators comprises a first end, a second end a first mirror at said first end and a second mirror at said second end, the mirrors of at least one end being seperate from one another.

6. The photodiode of claim 5, wherein:
   said mirrors of one end are respectively divided from a previously common mirror for all of said resonators.

7. The photodiode of claim 1, wherein:
   each of said resonators comprises first and second ends and first and second reflectors at said ends, respectively, said first and second reflectors disposed at an angle with respect to one another.

8. The photodiode of claim 1, wherein:
   said substrate comprises a region constituting an input coupling waveguide.

9. The photodiode of claim 8, wherein:
   said region is coupled in parallel to said resonators as a broadband resonator.

10. The photodiode of claim 1, and further comprising:
    means for preselecting the frequencies of the radiation to be detected.

11. The photodiode of claim 1, in combination with a plurality of such photodiodes arranged in succession and optically connected in series.

* * * * *